(12) United States Patent
Jeon

(10) Patent No.: US 6,305,390 B1
(45) Date of Patent: Oct. 23, 2001

(54) METHOD FOR CLEANING INSIDE OF CHAMBER USING RF PLASMA

(75) Inventor: Jin-ho Jeon, Austin, TX (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/204,365

(22) Filed: Dec. 4, 1998

(30) Foreign Application Priority Data

Dec. 5, 1997 (KR) .................................................. 97-66342

(51) Int. Cl.[7] ........................................................ B08B 6/00
(52) U.S. Cl. ........................ 134/1.1; 134/22.1; 134/22.18; 438/905
(58) Field of Search ................................. 134/1, 1.2, 1.1, 134/1.3, 22.1, 22.18; 438/905; 156/345; 216/67; 204/298.3; 118/715, 692

(56) References Cited

U.S. PATENT DOCUMENTS

| | | | | |
|---|---|---|---|---|
| 4,960,488 | * | 10/1990 | Law et al. ............................. | 156/643 |
| 5,158,644 | * | 10/1992 | Cheung et al. ....................... | 156/643 |
| 6,030,902 | * | 2/2000 | Donohoe .............................. | 438/714 |

* cited by examiner

*Primary Examiner*—Alexander Markoff
(74) *Attorney, Agent, or Firm*—Jones Volentine, PLLC

(57) ABSTRACT

A method for cleaning the inside of a chamber using a radio frequency (RF) plasma, in which all parts within the camber can be completely cleaned. In the cleaning method, the conditions inside the chamber are stabilized. Then, impurities are cleaned from the inside of the chamber using the RF plasma, while varying the pressure in the chamber continuously or in discrete steps.

6 Claims, 2 Drawing Sheets

METHOD FOR CLEANING INSIDE OF CHAMBER USING RF PLASMA

BACKGROUND OF THE INVENTION

1. Field of the Invention

The present invention relates to a method for manufacturing a semiconductor device, and more particularly, to a method for cleaning the inside of a chamber using a radio frequency (RF) plasma.

2. Description of the Related Art

In order to form a film on the surface of a wafer when manufacturing a semiconductor device, a chemical vapor deposition (CVD) method based on a gaseous reaction within a vacuum chamber is used. However, when using CVD, a film of unwanted, contaminating reaction products or by products is deposited all over the inside of the chamber, and more importantly, on the surface of the wafer itself. These contaminants affect the physical and chemical properties of the film deposited on the wafer, and generate particles which further contaminate the wafer. It is therefore necessary to remove the unwanted reaction product deposited inside the chamber after a certain number of wafers have been processed. A cleaning method using a plasma has been used to remove the unwanted reaction product from the inside of the chamber.

According to the contaminants plasma cleaning method, a plasma gas source is supplied to the chamber to be cleaned, and an electric field is applied, causing a cathode to emit electrons. The emitted electrons collide with the source gas, generating a plasma consisting of electrons, cations and variety of neutral species. This plasma strikes against and cleans the inner surface of the chamber.

The state of the art plasma cleaning methods use a constant pressure and a constant RF power. However, only certain parts of the chamber are cleaned, permitting contaminating reaction products to accumulate on other parts of the chamber over many deposition and cleaning cycles. Also, since adhesion between the accumulated deposited materials is weak, over time the deposited materials separate from or fall off of the surface of the chamber generating particles that reduce semiconductor device yield.

In order to prevent the accumulation of the contaminating reaction products, the typical cleaning cycle, in which the chamber is cleaned once every nine wafers, may be reduced. However, frequent cleaning reduces throughput and is inefficient.

SUMMARY OF THE INVENTION

An objective of the present invention is to provide a cleaning method that cleans the entire inner surface of a chamber using a radio frequency (RF) plasma.

It is therefore an aspect of the present invention to provided a method for cleaning the inside of a chamber using a radio frequency (RF) plasma, that includes stabilizing the inside of the chamber so that the inner surface coated with accumulated layers of contaminants can be removed through cleaning. The inside of the chamber is then cleaned using the RF plasma while continuously varying the pressure inside the chamber.

When cleaning the inside of the chamber, the pressure of the chamber may be continuously varied within the range from about 100 m Torr to about 800 m Torr, preferably, from a high pressure in the range of about 600 m Torr to a low pressure in the range of about 150 m Torr.

In another aspect of the invention, the RF plasma is obtained by applying RF power that varies according to pressure changes in the chamber, which ranges from 150 W to 500 W. It is an advantage of the present invention that the cleaning step may be performed for less than 200 seconds.

In another aspect, cleaning is performed simultaneously with introducing an inert gas through the backside of a susceptor installed in the lower portion of the chamber in order to clean the bottom of the susceptor.

It is an advantage of the present invention that by varying pressure and RF power inside the chamber, all parts inside the chamber are cleaned.

DETAILED DESCRIPTION OF THE PREFERRED EMBODIMENTS

Figure 2:
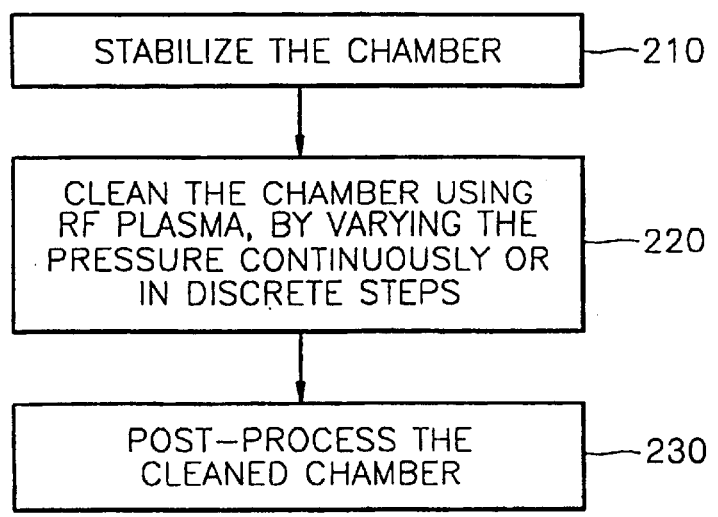
FIG. 2 is a flowchart illustrating a method for cleaning a chamber using radio frequency (RF) power, according to a preferred embodiment of the present invention.
Figure 3:
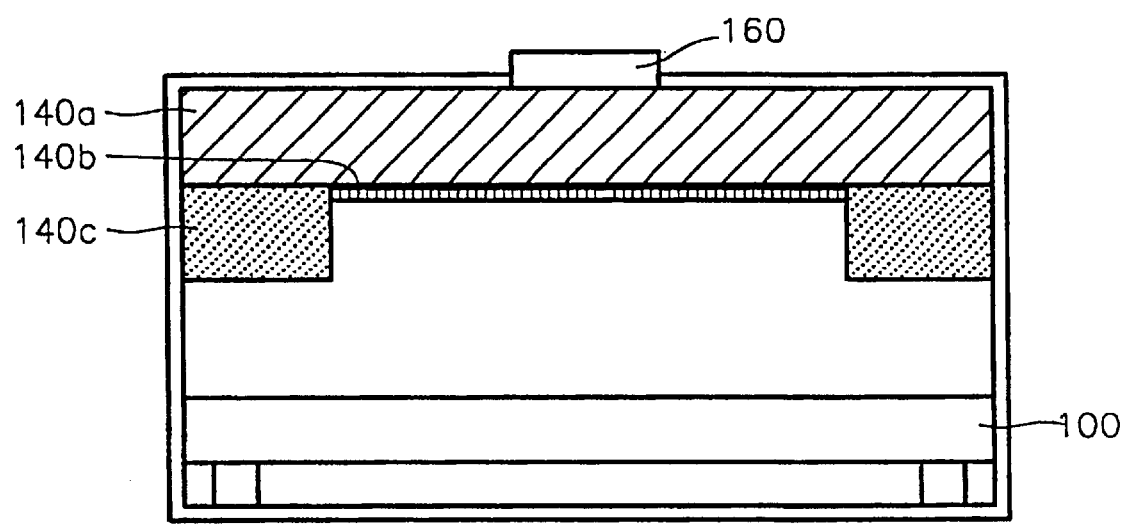
FIG. 3 is a section view of a chamber cleaned by the method according to the present invention.

A method for cleaning a CVD chamber using RF plasma according to the present invention will be hereinafter described in detail with reference to FIG. 1 to FIG. 3.

Figure 1:
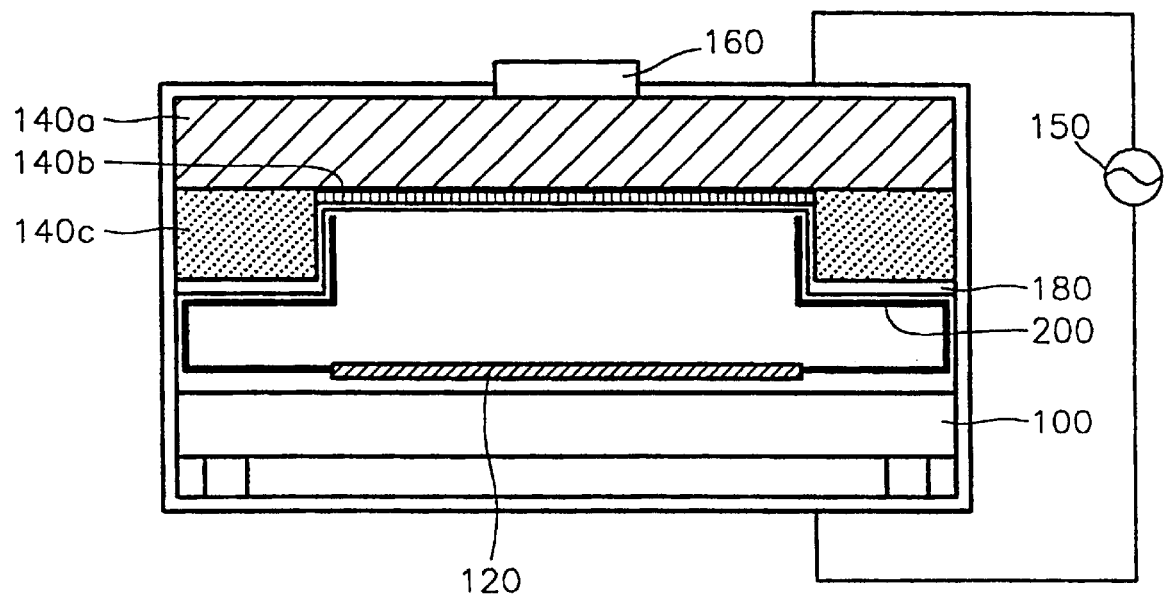
FIG. 1 is a section view of a chamber in which impurities are deposited over an entire inner surface of the chamber.

Referring to FIG. 1, contaminating material layers 200 and 180 which are to be removed through cleaning, are deposited over the entire inner surface of a chamber. The chamber has the following structure. A suscepter 100 capable of acting as an anode, on which a wafer 120 is mounted, is installed in the lower portion of the chamber. A gas inlet 160, through which plasma source gas is introduced, is placed in the upper portion of the chamber. A shower head 140a having gas holes 140b, through which gas is introduced into the chamber, is placed below the gas inlet 160, supported by shower head guides 140c. The shower head 140a acts as a cathode. To generate a plasma for cleaning, RF power 150 is applied between the suscepter 100 which acts as an anode, and shower head 140a which acts as a cathode.

The contaminating material layer 180 is a thin chemical vapor deposition (CVD) layer which covers the entire inner surface of the chamber that is formed in the process of setting the atmosphere inside the chamber to be the same as the atmosphere used in an actual CVD process.

When an actual CVD layer is formed on a wafer within the stabilized chamber, the inner surface of the chamber becomes covered with the material layer 200 as a reaction product or byproduct of the CVD process.

A method for cleaning the chamber of FIG. 1 using an RF plasma will now be described with reference to the flowchart of FIG. 2.

The cleaning method using an RF plasma according to the present invention starts with stabilizing the inside of a chamber (210).

In a preferred embodiment, stabilizing the chamber includes increasing the temperature inside the chamber, and stabilizing a plasma source gas.

First, the temperature of the chamber to be cleaned is increased until a plasma gas is activated. In a preferred embodiment, an inert gas, e.g. argon (Ar) gas, is supplied to the chamber. The Ar gas (hereinafter referred to as a backside gas), is introduced along the back side of the suscepter 100. The Ar gas ensures uniform heat transfer within the chamber.

Preferably, the temperature of the chamber during RF plasma cleaning is above room temperature, more preferably the temperature is approximately 420° C.

After the chamber temperature has been adjusted, the plasma source gas inlet 160 is stabilized. To accomplish this, the plasma source gas is vented at a predetermined flow rate for a short time to stabilize the plasma source gas inlet 160 so that the plasma source gas is continuously supplied into the chamber.

After the inner chamber has been stabilized, it is cleaned using an RF plasma (220). RF power is applied between the shower head 140a which functions as a cathode and the suscepter 100 which functions as an anode. Then the plasma source gas is introduced into the chamber via the gas inlet 160, thereby generating a plasma in the chamber. This plasma reacts with the contaminating material layer 200 composed of reaction products or byproducts and the CVD layer 180, thereby separating them from the inner surface of the chamber.

The backside gas is continuously provided below the suscepter 100 thereby preventing the plasma source gas from entering below the suscepter 100 and removing an unnecessary film that may have formed below the suscepter due to sputtering when using the backside gas.

According to a first embodiment of the present invention, the pressure inside the chamber is continuously varied throughout the entire cleaning process. Thus, a plasma is generated while the pressure inside the chamber is continuously varied within the range from 100 m Torr to 800 m Torr. If the applied pressure is out of this range, that is, less than 100 m Torr or higher than 800 m Torr, the chamber and the equipment inside may be damaged. It is therefore preferable to vary the pressure inside the chamber within the range from 150 m Torr to 600 m Torr.

Continuously varying the pressure from high to low, e.g., from 800 m Torr to 100 m Torr, prevents swirling in the gas flow. The higher the pressure is, the more the RF plasma moves to the outer edges of the chamber. Conversely, as the pressure decreases, a high vacuum is created inside the chamber which causes the RF plasma to concentrate at the center of the chamber. In a high-vacuum chamber, the number of contaminating particles is less, so that the number of collisions with the plasma decreases. Accordingly, a mean free path, which is the movable distance of the plasma, is longer. This means that the plasma is concentrated on the edges of the chamber. Thus, under a high pressure, the border of the suscepter 100 which is located at the edges of the chamber is cleaned, while the shower head 140a located at the center of the chamber is cleaned under a low pressure. The gas holes 140b of the shower head 140a are cleaned last.

An important advantage of the present invention over the other conventional cleaning methods is that the entire area in the chamber is cleaned as a consequence of varying the pressure inside the chamber during the cleaning process. Another advantage is that the total cleaning time is no longer than 200 seconds.

According to the present invention, the RF power applied to the shower head 140a and the suscepter 100 is varied within the range from 150 W to 500 W as the pressure inside the chamber changes and to adjust the cleaning time.

According to a second embodiment of the present invention, the cleaning is performed while the pressure inside the chamber is varied through multiple steps. The cleaning is classified as (1) cleaning the outer edges of the chamber, e.g., the border of the suscepter 100, using a first pressure, e.g., a pressure ranging from 600 m Torr to 800 m Torr; (2) cleaning the center of the chamber, e.g., the shower head 140a using a second pressure which is lower than the first pressure, e.g., a pressure ranging from 300 m Torr to 600 m Torr; and (3) cleaning the remaining portion of the chamber, which is not cleaned in (1) or (2) such as the gas holes 140b of the shower head 140a using a third pressure which is lower than the second pressure, e.g., a pressure ranging from 100 m Torr to 300 m Torr. To clean the chamber as described in (1), (2) or (3), RF power 150 ranging from 150W to 500 W is applied to the shower head 140a and the suscepter 100. The level of the RF power is adjusted according to the plasma characteristics. The duration of cleaning according to (1), (2) or (3) is determined by adjusting the RF power. The higher the RF power, the shorter the cleaning time. However, the entire cleaning time including the time to execute cleaning according to (1), (2) or (3) does not exceed 200 seconds.

Finally, the chamber is subjected to a post-cleaning process (230) after the RF plasma cleaning is complete. The post-cleaning process includes pumping out the unwanted reaction products that were removed from the inner surface of the chamber during the cleaning process. Introduction of the backside gas is stopped before post-cleaning.

Also, in order to provide for the case where the byproduct is not completely removed from the chamber during the pumping step, the inside of the chamber is purged with an inert gas to completely remove any unwanted material layers 200 and 180, which are impurities in the chamber, thereby completing the cleaning process. FIG. 3 is a section view of the chamber which has completed the cleaning process. As shown in FIG. 3, all parts within the chamber, particularly, the gas holes 140b at the center of the chamber, which can not be cleaned easily by a conventional cleaning method, are completely cleaned.

The present invention will be described in detail through the following non-limiting examples.

EXAMPLE

Creating a Contaminated Chamber that is ready to be Cleaned (FIG. 1).

A tungsten silicide layer (WSi) 180 was formed as a CVD layer.

Silane ($SiH_4$) gas was introduced into the chamber at a rate of 400 sccm for about 10 seconds under a pressure of 300 m Torr, and tungsten hexafluoride ($WF_6$) was vented at a rate of 3 sccm. Then, silane and tungsten hexafluoride were introduced into the chamber for about 210 seconds, each at a rate of 400 sccm and 3 sccm, to deposit a tungsten silicide layer 180 (see FIG. 1) on the entire inner surface of the chamber, to a thickness ranging from 5,000 Å to 8,000 Å, thereby stabilizing the conditions within the chamber. After deposition, the pressure in the chamber was reduced for about 20 seconds to remove the remaining gas.

Then, nine wafers were sequentially loaded onto the chamber, and a tungsten silicide layer was deposited on each wafer to a thickness of about 1,500 Å. As a result, the inner surface of the chamber was deposited with the reaction product layer or byproduct layer 200, as shown in FIG. 1.

After forming the tungsten suicide layers on these nine wafers, the chamber was cleaned as follows. A plasma for cleaning was generated using nitrogen trifluoride ($NF_3$) as a source gas.

First, the pressure of the chamber was adjusted to 50 m Torr and Ar and backside Ar (BS Ar) gas were introduced into the chamber, respectively at rates of 200 sccm and 30 sccm, while the temperature inside the chamber was simultaneously increased to 420° C. Then, the pressure of the chamber was increased to 600 mTorr and nitrogen trifluoride (NF$_3$) was vented at a rate of 250 sccm for 3 seconds. At this point, the backside Ar gas was continuously introduced at a rate of 30 sccm.

The cleaning was then performed using RF plasma. In this example, the pressure of the chamber was varied to three different levels during the cleaning, as in the second embodiment of the present invention. First, the pressure of the chamber was maintained at 600 m Torr, nitrogen trifluoride (NF$_3$) was introduced into the chamber via the gas inlet 160 at a rate of 250 sccm for 120 seconds, and 350 W RF power was applied between the shower head 140a and the suscepter 100 to form an RF plasma in the chamber. The generated RF plasma reacted with the tungsten silicide layers 200 and 180 (see FIG. 1) deposited on the inner surface of the chamber. The backside Ar gas was continuously introduced at a rate of 30 sccm during the cleaning process in order to prevent nitrogen trifluoride (NF$_3$) from flowing below the suscepter to remove the unnecessary layers formed below the suscepter through Ar sputtering.

Second, the pressure of the chamber was lowered to 400 m Torr, and nitrogen trifluoride (NF$_3$) was introduced at a rate of 250 sccm for 20 seconds. Here, the applied RF power was approximately 350 W.

Third, the pressure of the chamber was lowered to 200 m Torr to create a high vacuum, and then nitrogen trifluoride (NF$_3$) was introduced at a rate of 250 sccm for 20 seconds. Here, the applied RF power was approximately 250 W.

In a post-cleaning step, while reducing the pressure of the chamber almost to a vacuum, the tungsten silicide layers 200 and 180 which had separated from the inner surface of the chamber through the three levels of cleaning were pumped out. At this point, introduction of the backside Ar gas was stopped. Then, the pressure of the chamber was adjusted to 50 m Torr and Ar gas was introduced at a rate 400 sccm for 30 seconds, thereby completely removing the remaining byproducts that were not pumped out.

The cleaning process of this example was conditioned as in the following Table 1.

TABLE 1

| Steps | \multicolumn{10}{c}{Cleaning Process} |
|---|---|---|---|---|---|---|---|---|---|---|
| | 1 | 2 | 3 | 4 | 5 | 6 | 7 | 8 | 9 | 10 |
| Time (s) | 10 | 210 | 20 | 30 | 3 | 120 | 20 | 20 | 30 | 30 |
| Pressure (mTorr) | 300 | 300 | — | 50 | 600 | 600 | 400 | 200 | — | 50 |
| RF power (W) | — | — | — | — | — | 350 | 350 | 250 | — | — |
| BS Ar (sccm) | 30 | 30 | — | 30 | 30 | 30 | 30 | 30 | — | 30 |
| Ar (sccm) | 200 | 200 | — | 200 | — | — | — | — | — | 400 |
| WF$_6$ (sccm) | 3* | 3 | — | — | — | — | — | — | — | — |
| NF$_3$ (sccm) | — | — | — | — | 250* | 250 | 250 | 250 | — | — |
| SiH$_4$ (sccm) | 400 | 400 | — | — | — | — | — | — | — | — | notes 1) *venting
2) step 1- supplying silane; step 2- depositing WSi layer; step 3- rermoving the remaining gas; step 4- increasing temperature of the chamber; step 5- stabilizing NF$_3$ gas inlet; step 6- first cleaning; step 7- second cleaning; step 8- third cleaning; step 9- pumping; and step 10- purging As a result, the tungsten silicide layers deposited over the entire inner surface of the chamber were completely removed. In particular, the gas holes of the shower head, which could not be completely cleaned by a conventional cleaning method using a constant pressure and a constant RF power, were completely cleaned.

Comparative Example

For comparison with the above Example, the same procedure outlined in the Example above was performed except that the cleaning step was performed at a constant pressure and with a constant RF power as tabulated in Table 2 to simulate the conventional cleaning methods. During the cleaning, the pressure of the chamber was maintained at approximately 600 m Torr, nitrogen trifluoride (NF$_3$) was introduced at a rate of 250 sccm for 160 seconds, and a constant RF power of 250 W was applied, to generate an RF plasma.

TABLE 2

| Steps | \multicolumn{8}{c}{Comparative Cleaning Process} |
|---|---|---|---|---|---|---|---|---|
| | 1 | 2 | 3 | 4 | 5 | 6 | 7 | 8 |
| Time (s) | 10 | 210 | 20 | 30 | 3 | 160 | 30 | 30 |
| Pressure (mTorr) | 300 | 300 | — | 50 | 600 | 600 | — | 50 |
| RF power (W) | — | — | — | — | — | 250 | — | — |
| BS Ar (sccm) | 30 | 30 | — | 30 | 30 | — | — | — |
| Ar (sccm) | 200 | 200 | — | 200 | — | — | — | 400 |
| WF$_6$ (sccm) | 3* | 3 | — | — | — | — | — | — |
| NF$_3$ (sccm) | — | — | — | — | 250* | 250 | — | — |
| SiH$_4$ (sccm) | 400 | 400 | — | — | — | — | — | — | notes 1) *venting
2) step 1- supplying silane; step 2- depositing WSi layer; step 3- removing the remaining gas; step 4- increasing temperature of the chamber; step 5- stabilizing NF$_3$ gas inlet; step 6- cleaning; step 7- pumping; and step 8- purging When constant pressure and RF power were used as is done in conventional cleaning, contaminating reaction products remained in the gas holes of the shower head. As described above, the RF plasma cleaning method of the present invention is performed through multiple levels by varying the pressure continuously or in discrete intervals. As a result, all parts of the chamber, including the gas holes of the shower head, are uniformly cleaned, thereby preventing the generation of particles that would otherwise contaminate the chamber for future use.

What is claimed is:

1. A method for cleaning an inside of a chamber using a radio frequency (RF) plasma, comprising:

(a) stabilizing the inside of the chamber, an inner surface of which has material layers to be removed through cleaning;

(b1) cleaning outer edges of the chamber at a pressure ranging from 600 m Torr to 800 m Torr using the RF plasma:

(b2) cleaning a center portion of the chamber at a pressure ranging from 300 m Torr to 600 m Torr using the RF plasma; and (b3) cleaning a portion of the chamber that was not cleaned during said cleaning in (b1) and (b2), at a pressure ranging from 100 m Torr to 300 m Torr using the RF plasma, wherein an inert gas is introduced into the chamber during said cleaning in (b1) through (b3), through a backside of a suscepter installed in a lower portion of the chamber, to clean the suscepter.

2. The method of claim 1, wherein (a) further comprises:

(a1) increasing a temperature inside the chamber to over room temperature; and (a2) stabilizing an RF plasma source gas inlet by venting RF plasma source gas from the chamber.

3. The method of claim 1, wherein during said cleanings of (b1) through (b3), the RF plasma is generated by applying RF power in a range of from 150 W to about 500 W to the chamber.

4. The method of claim 1, wherein the RF power applied during said cleanings of (b1), (b2) and (b3) is inversely proportional to duration of said cleanings of (b1), (b2), and (b3).

5. The method of claim 1, wherein after said cleanings of (b1) through (b3), the method further comprises pumping out the material layers separated from the inner surface of the chamber during said cleanings of (b1) through (b3).

6. The method of claim 5, wherein after the pumping, the inside of the chamber is purged.

* * * * *